(12) United States Patent
Rau et al.

(10) Patent No.: US 7,265,919 B2
(45) Date of Patent: Sep. 4, 2007

(54) FLANGE ASSEMBLY OF AN OPTICAL SYSTEM

(75) Inventors: Johannes Rau, Gerstetten (DE); Martin Mahlmann, Lauchheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 30 days.

(21) Appl. No.: 10/985,450

(22) Filed: Nov. 10, 2004

(65) Prior Publication Data

US 2005/0099704 A1    May 12, 2005

(30) Foreign Application Priority Data

Nov. 12, 2003 (DE) .............................. 103 52 820

(51) Int. Cl.
*G02B 7/02* (2006.01)

(52) U.S. Cl. .................. 359/820; 359/819; 359/811

(58) Field of Classification Search ................ 359/820
See application file for complete search history.

(56) References Cited

U.S. PATENT DOCUMENTS

| 5,323,228 | A | * | 6/1994 | Moody | 356/469 |
|---|---|---|---|---|---|
| 5,379,155 | A | * | 1/1995 | Goetschmann et al. | 359/820 |
| 5,557,474 | A | * | 9/1996 | McCrary | 359/820 |
| 5,781,355 | A | | 7/1998 | Meier | 359/871 |
| 6,097,553 | A | | 8/2000 | Griffin | 359/820 |
| 6,166,868 | A | | 12/2000 | Holderer et al. | 359/819 |
| 6,229,657 | B1 | | 5/2001 | Holderer et al. | 359/822 |
| 6,717,755 | B1 | * | 4/2004 | Katzman | 359/820 |
| 7,023,629 | B2 | * | 4/2006 | Sekine et al. | 359/820 |
| 7,061,698 | B2 | * | 6/2006 | Osterried et al. | 359/819 |
| 2002/0176094 | A1 | | 11/2002 | Petasch | 356/614 |

* cited by examiner

*Primary Examiner*—Ricky Mack
*Assistant Examiner*—Jessica T Stultz
(74) *Attorney, Agent, or Firm*—GrayRobinson, P.A.

(57) ABSTRACT

A flange assembly of an optical system has a first flange, a compensation element and a second flange. The flanges and the compensation element are substantially axially symmetric both flanges (2, 2') being suitable for being connected to other components of the optical system in a non-destructive, non-positive axially separable fashion. The two flanges consist of different materials with different coefficients of linear thermal expansion. The compensation element is radially soft, but connects the two flanges rigidly in their relative spatial position.

39 Claims, 3 Drawing Sheets

FLANGE ASSEMBLY OF AN OPTICAL SYSTEM

BACKGROUND OF THE INVENTION

PRIORITY CLAIM

Priority under 35 U.S.C. §119 is hereby claimed to German Patent Application Serial No. 103 52 820.2 filed Nov. 12, 2003.

1. Field of the Invention

The invention relates to a flange assembly of an optical system. The invention relates, furthermore, to a method for connecting two flanges. The invention likewise relates to an objective, in particular a projection objective in semiconductor lithography.

2. Description of the Related Art

When connecting two components with different coefficients of thermal expansion, the temperature-induced changes in diameter of the components result in stresses which can lead in precision systems to impermissible deformations, irreversible changes in frictional connections or destruction of components.

Particularly in the case of projection exposure machines with projection objectives for producing semiconductors, even minimal changes can lead to maladjustment of the projection objective when stresses occur in the above named way on the basis of different thermal expansions between the mounts of the lenses and the housing of the projection objective as support structure.

Consequently, as emerges from U.S. Pat. No. 6,166,868, in the case of such designs use is made of elastically resilient elements, often leaf spring elements, which are intended to balance out the different thermal expansions, these being arranged between the two components with the different coefficients of expansion, although as a result the connection frequently cannot be implemented with the desired rigidity. In order to produce the individual leaf spring elements, a connecting element with cut-outs must be provided by sawing up the connecting element in the edge region, or the spring elements must be individually fastened. Equally disadvantageous in this case is the high outlay on processing in order to achieve adequate planarity of a cut-up connecting element (disturbance of the internal stress conditions upon sawing up a turned part, and yielding of the leaf springs owing to processing forces) and the outlay on adjustment for individual elements. Furthermore, there is no gas tightness.

Reference may be made to U.S. Pat. No. 6,229,657 B1, U.S. Pat. No. 6,097,553 A, U.S. Pat. No. 5,781,355 A and U.S. Pat. No. 2002/176094 A1 for the prior art.

SUMMARY OF THE INVENTION

Consequently, it is an object of the invention to provide a flange assembly for balancing out different thermal expansions between two components, which flange assembly avoids the disadvantages, mentioned in the beginning, of the prior art, and connects the components to one another very rigidly.

The object is achieved according to the invention by means of the features of claim 1. Claim 24 achieves the object for a type of use in an objective.

Two components, in particular an optical assembly such as, for example, a lens mount, and a support structure, for example an objective housing, are intended according to the invention to be connected to one another in such a way that their different coefficients of linear thermal expansion or their thermal expansions as far as possible do not effect lens displacement or lens deformation. The connection between the flanges is performed according to the invention via a compensation element which is radially soft and connects the two flanges rigidly in their spatial position, the compensation element advantageously having a thin-walled, in particular closed cross section.

The thin-walled nature of the compensation element, in particular in the shape of a cylinder, ensures that the two flanges can expand independently of one another and that, in the process, the planarity, roundness and co-axiality of the flanges is retained. By contrast with the prior art, the de-coupling effect is not based on a bending softness of spring elements which have only a very restricted rigidity in the degrees of freedom which are not consciously released. Owing to the inventive configuration, the rigidity of the flange assembly can be substantially greater in all directions than would be the case for devices according to the prior art. Furthermore, the flanges can be processed in an uninterrupted cut, which leads to clean and more precise surfaces. The internal stress conditions in the flange assembly according to the invention are likewise not disturbed, since there is no need for sawing up as required in the prior art when use is made of leaf springs.

Owing to the inventive configuration of the flange assembly, a CTE jump (location at which the coefficient of thermal expansion of one material comes into contact with the coefficient of thermal expansion of the other material) can be moved to a stable joint in relation to at least one flange inside the compensation element or coupling element. This means that the CTE jump is moved to the site where the compensation element is stably connected to the flange, for example by adhesion or welding. The joint can be designed in this case to be so stable that the connection is not impaired in the event of differences in expansion. The stresses resulting in the region of the CTE jump can be kept small, particularly through the thin-walled nature of the compensation element. In addition, in accordance with the conditions of rigidity for the compensation element and flange, the stresses predominantly effect a harmless deformation of the compensation element, while the flange experiences only very slight deformations.

Further important advantages of the flange assembly are that, for example, the stress conditions resulting from the joining do not affect the geometry or their accuracy, and that the internal stresses and their variations over time (relaxation) play a subordinate role, rather, in the accuracy of the flange assembly by comparison with the individual leaf springs in the prior art. A small radial space requirement and a simple design of the flange assembly are likewise further advantages. It is advantageously possible by means of the flange assembly according to the invention to prevent an introduction of a three leaf clover to a lens which is supported in the lens mount.

In a particularly advantageous refinement of the invention, it is provided that the compensation element is monolithic with at least one flange, the result being that the compensation element has the coefficient of thermal expansion of the flange with which it is monolithically embodied. The advantage of the monolithic refinement is the simple production of the flange assembly, since one flange and the compensation element can be designed jointly in a concentric fashion, for example, it being possible for the compensation element to be produced approximately true to size.

Exemplary embodiments of the invention are explained below in more detail with the aid of the drawings, in which:

DETAILED DESCRIPTION

Figure 1:
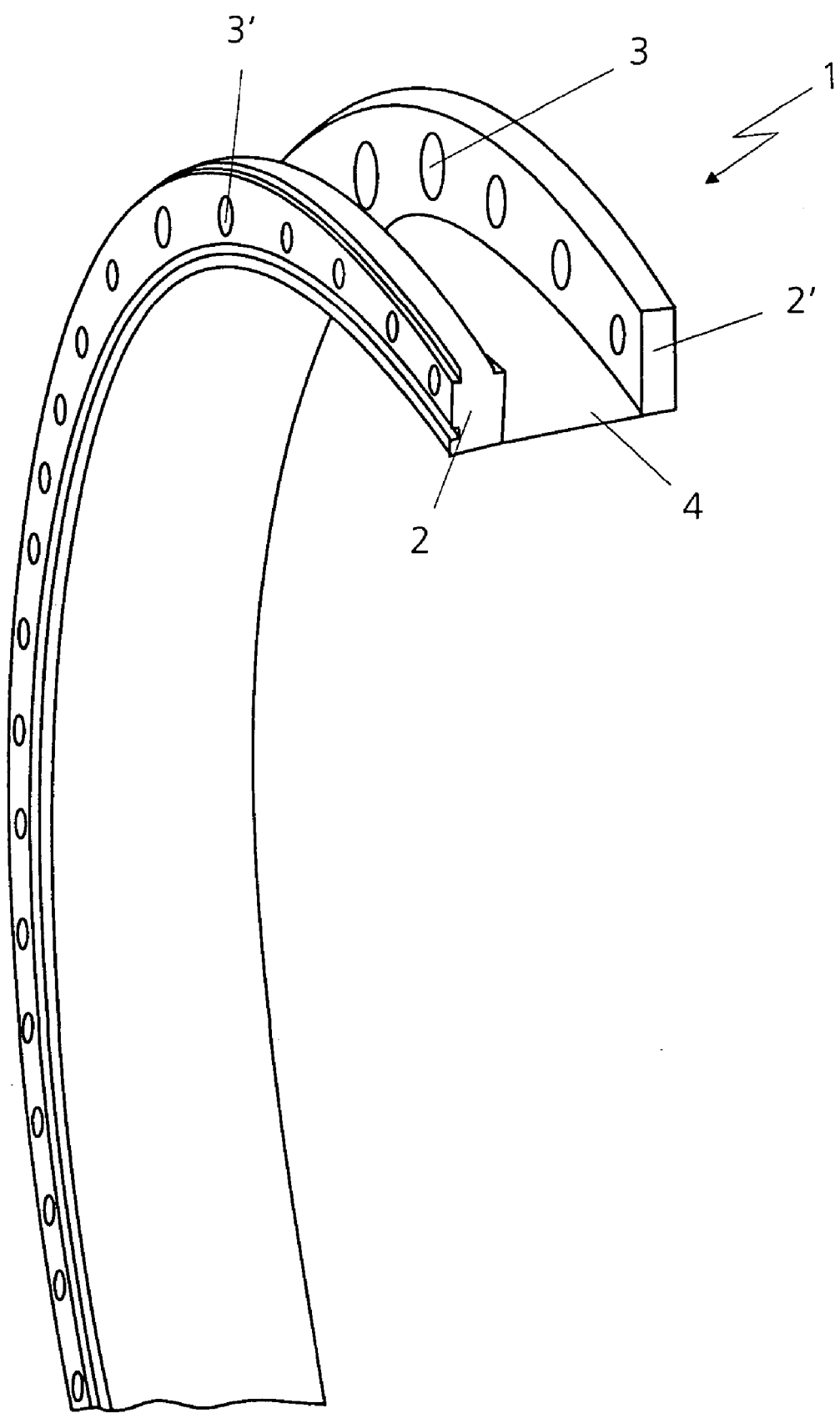
FIG. 1 shows a sketch of a flange assembly according to the invention, in a (partially) perspective view.

FIG. 1 shows a device or flange assembly 1 which has two flanges 2 and 2' which are preferably embodied as annular flanges. The flanges 2 and 2' serve the purpose of connecting two components such as, for example, a lens with a lens mount as optical assembly, and a support structure, for example an objective housing, as illustrated in principle in FIG. 3. The two flanges 2, 2' each have mutually differing coefficients $\alpha_1$ and $\alpha_2$ of linear thermal expansion, the flanges 2 and 2' being able in each case to have one coefficient of thermal expansion which can correspond approximately to that of the respectively adjacent component. The flanges 2 and 2' are provided with bore holes 3 and 3', the components, in particular the lens mount and the support structure, being able to be connected to the flanges 2 and 2' via screwed connections. The flanges 2 and 2' are connected to one another via a compensation element or connecting element 4. The compensation element 4 preferably has a thin-walled, closed cross section in the shape of a cylinder or a tube, the cross section preferably being circular, oval or else polyhedral, with a wall thickness of approximately 0.01 mm to 3 mm, in particular 0.1 mm to 1 mm.

It is particularly advantageous that the compensation element 4 is unipartheid or monolithic with the flange 2', the unipartheid nature meaning that the compensation element 4 has the same coefficient $\alpha_2$ of linear thermal expansion as the flange 2', which is a one piece with it.

If the compensation element 4 is not monolithic with the flange 2', the coefficient of linear thermal expansion of the compensation element 4 can have a value which lies between the values of the coefficients $\alpha_1$ and $\alpha_2$ of linear thermal expansion of the two flanges 2 and 2', in order as a result to produce only minimal differences in expansion of paired flanges 2 and 2' with the compensation element 4 in the event of temperature changes. The result of this is only minimal loading of the respective joint with the flange 2 or 2', respectively.

FIGS. 2a to 2i illustrate various possible types of joint of the compensation element 4 with the flanges 2 and 2'.

Figure 2A:
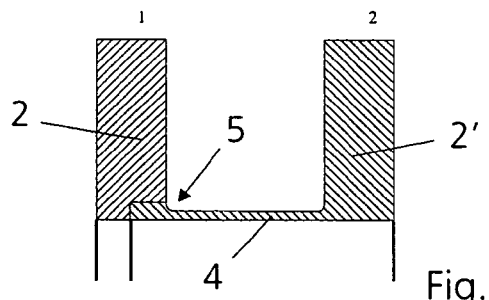
FIGS. 2a to 2i show sketches of various types of joint of the flange assembly shown in FIG. 1.
Figure 2B:
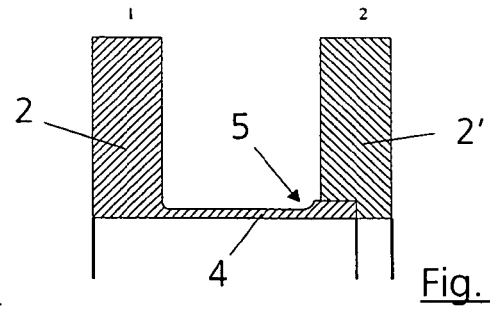
Figure 2C:
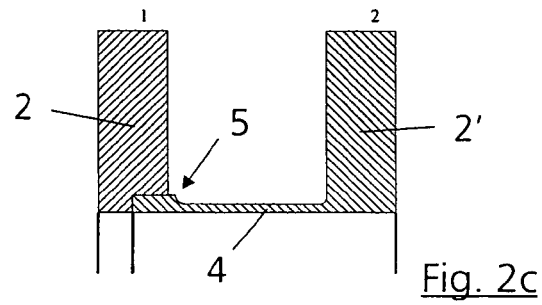

FIGS. 2a to 2c show the two flanges 2 and 2', the first flange 2 being produced, for example, from INVAR or ceramic, and the second flange 2' from, for example, steel. In each case, the compensation element 4 is here monolithic with a flange. A connecting site 5 between the compensation element 4 and the flange 2 can be produced by soldering, welding, pressing in, shrinking on or adhesion. The part of the compensation element 4 which is to be connected to the flange 2 can have a somewhat greater wall thickness.

Figure 2D:
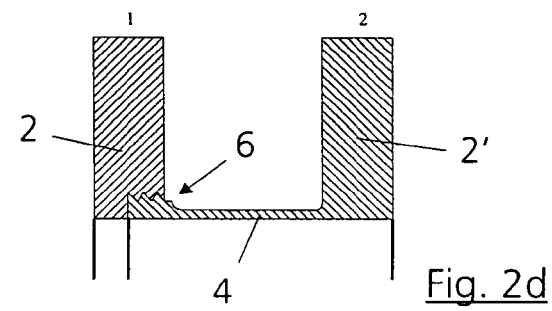

FIG. 2d shows a further possibility of connecting the compensation element 4 to the flange 2, specifically via a screwed connection 6. Here, the compensation element 4 has an external thread, and the flange 2 an internal thread. The flange 2 can therefore be connected to the compensation element 4 or to the further flange 2' by being screwed on. Furthermore, an even more secure connection can be ensured by additional bonding or welding of the screwed connection 6.

Figure 2E:
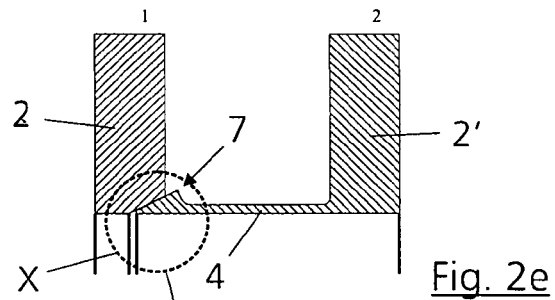

The connection of the compensation element 4 to the flange 2 is implemented in FIG. 2e by a cone 7. This connection can be secured by an adhesive, if appropriate. The conical part 7, which is illustrated specifically in the enlarged detail corresponding to X, can likewise be provided with a groove 8 at the connecting surface to the flange 2. It is thereby possible for an adhesive to soften when introduced, and to ensure optimal security. Roundness tolerances and diameter tolerances of the compensation element 4 can be balanced out by the cone 7. The connection can also be performed without an integral connection such as bonding. As already mentioned above, it would be possible to perform adhesion or welding for the sake of security.

Figure 2F:
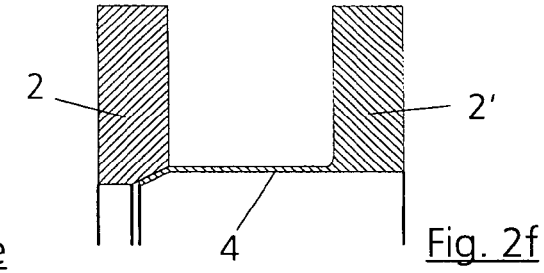

A similar connecting possibility to that in FIG. 2e is illustrated in FIG. 2f. Here, the thin-walled, preferably cylindrical compensation element 4 is introduced into the flange 2 by pressing (frictional joining method) (elastic to plastic tapering of the compensation element 4). It can be smeared with adhesive and secured, if appropriate. Welding is also possible for the sake of securing and sealing.

Figure 2G:
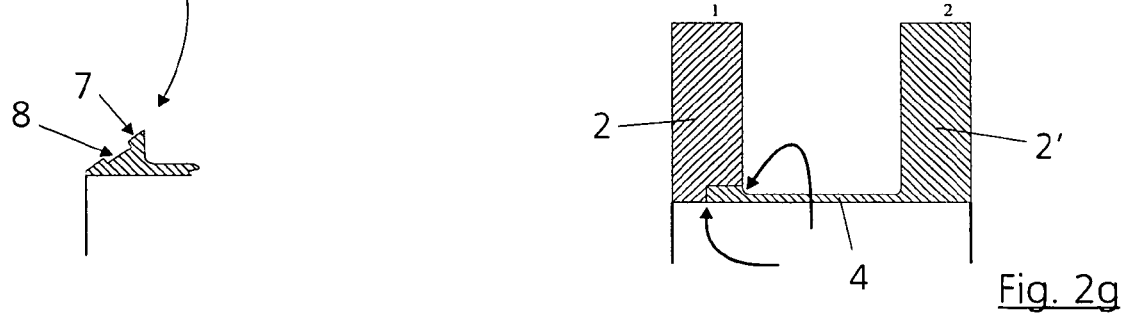

The connection of the compensation element 4 to the flange 2 is performed in FIG. 2g by welding. As in FIGS. 2a to 2c, here the part of the compensation element 4 which is to be connected to the flange 2 is embodied with a larger wall thickness so that the thin-walled part of the compensation element 4 is not damaged by the welding. The integral joining method of welding is advantageous because there is no need to use adhesives, and therefore outgasings are prevented.

Figure 2H:
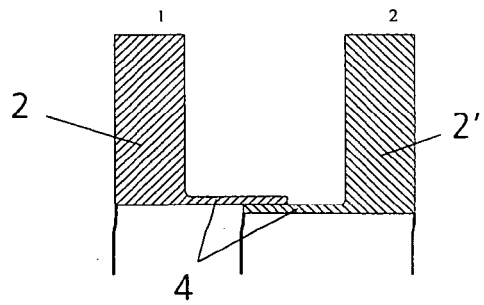

It is also conceivable to produce both flanges 2 and 2' as monolithic parts with in each case a segment of the compensation element 4, as illustrated in FIG. 2h, the result being that the joint is situated approximately in the middle of the overall compensation element 4. The influence of the joint would thereby be smaller. This means that the connecting site is not so rigidly designed, and so it can yield to both sides. The result of this is a very small loading of the joint.

Figure 2I:
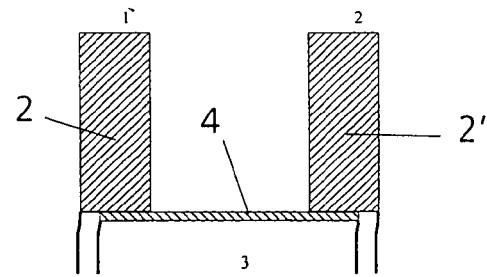

The smallest stresses inside the flange assembly 1 can be produced by the compensation element 4 made from a third material with a coefficient $\alpha_3$ of linear thermal expansion which should lie between the first and the second flange 2 and 2' (FIG. 2i). The advantage here resides in the fact that the transition from $\alpha_1$ to $\alpha_2$ is distributed over two sites. Producing the compensation element 4 from a third material with a very small coefficient $\alpha_3<2$ ppm/K of linear thermal expansion, for example INVAR, is advantageous for minimizing the axial change in length, irrespective of the coefficient of expansion of the two flanges 2 and 2', for example aluminium, INVAR or steel.

Figure 3:
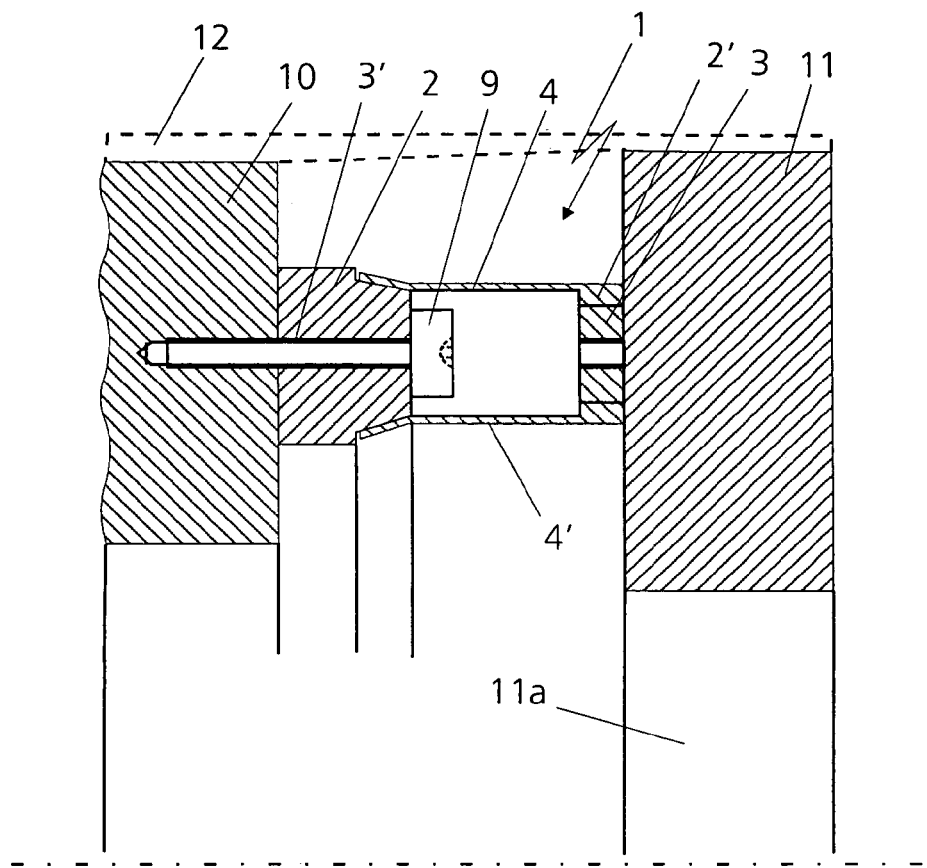
FIG. 3 shows an alternative embodiment of the inventive flange assembly according to FIG. 1 with two connecting elements.

FIG. 3 shows an alternative embodiment of the flange assembly 1 illustrated in FIGS. 1 and 2. The connection of the two flanges 2 and 2' is performed here by two coaxial, thin-walled compensation elements 4 and 4'. The flange 2, which is intended to be connected to the compensation elements 4 and 4', can be conically embodied, as illustrated in this exemplary embodiment. This connection of the flange 2 to the compensation elements 4 and 4' can be undertaken with the aid of various connecting methods, as already described in the preceding exemplary embodiments. As already mentioned, the flanges 2 and 2' have bore holes 3 and 3' for holding screws 9, in order to connect the flange assembly 1 to the components 10 and 11, the component 10 constituting the support structure, for example the objective housing, of an objective 12 for semiconductor lithography and the component 11 constituting the lens mount with a lens 11a.

Figure 4:
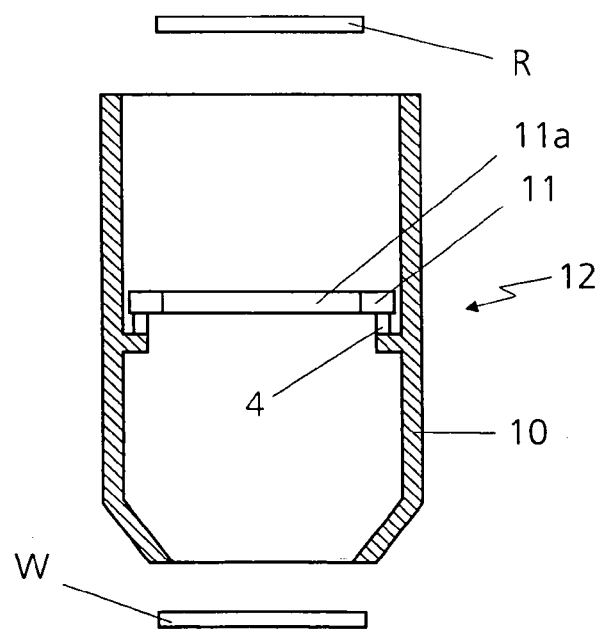
FIG. 4 shows an objective for semiconductor lithography with an embodiment according to FIG. 3.

FIG. 4 shows an objective 12 with the embodiment according to FIG. 3 in principle. The objective 12 images a mask M on a substrate W, which is provided with a photoresist layer. When the flange assembly 1 is embodied with two compensation elements 4 and 4', the bore hole 3 can have a larger opening, in order to be able to pass the screw 9 through together with the screw head. As a result, the screw 9 can be inserted into the bore hole 3', in order thus to connect the flange 2 to the component 10, i.e. the objective housing 10.

The compensation element 4 can also alternatively be provided with cut-outs, there being no preference for any specific shape of the cut-outs.

A stable and very precise connection can be rendered possible by pressing together axially or shrinking in or on. In the case of shrinking on, the compensation element 4 can be connected to the flange 2 without force. The flange 2 can likewise be provided here with a cone, as in the case of pressing together.

The coaxial nature of the elements relative to one another is retained in the case of both methods.

Although the flanges 2 and 2' are designed as annular flanges in the exemplary embodiments, they can, of course, also be produced in another shape, for example a triangular or polygonal flange.

The planarity and coaxial and parallel nature of the two flanges 2 and 2' can be retained in the event of changes in temperature owing to the configuration of the flange assembly 1.

The invention claimed is:

1. A flange assembly of an optical system, comprising: a first flange, a compensation element and a second flange, said first and second flanges and said compensation element being substantially axially symmetric, both said first and second flanges being connectable to other components of the optical system in a non-destructive, non-positively axially separable fashion, said first and second flanges consisting of different materials with different coefficients of linear thermal expansion, and said compensation element being radially soft but connecting said first and second flanges rigidly in their relative spatial position.

2. A flange assembly according to claim 1, wherein said compensation element comprises a thin-walled cross section.

3. A flange assembly according to claim 2, wherein said compensation element is of at least approximately cylindrical shape.

4. A flange assembly according to claim 2, wherein said compensation element comprises a polygonal cross section.

5. A flange assembly according to claim 2, wherein said cross section is closed.

6. A flange assembly according to claim 1, wherein said compensation element is monolithic with at least one flange.

7. A flange assembly according to claim 1, wherein said flanges in each case have a coefficient of linear thermal expansion which corresponds approximately to that of the respectively adjacent component.

8. A flange assembly according to claim 1, wherein said compensation element has a wall thickness of 0.01 mm to 3 mm.

9. A flange assembly according to claim 1, wherein the coefficient of linear thermal expansion of said compensation element has a value which lies between the values of the coefficients of linear thermal expansion $\alpha_1$ and $\alpha_2$ of the two flanges.

10. A flange assembly according to claim 1, wherein said compensation element has a low coefficient of linear thermal expansion $\alpha_3$, in particular $\alpha_3 < 2$ ppm/K.

11. A flange assembly according to claim 1, wherein said compensation element is provided with cut-outs.

12. A flange assembly according to claim 1, wherein said flanges are designed as annular flanges.

13. A flange assembly according to claim 1, wherein said flanges are designed as polygonal flanges.

14. A flange assembly according to claim 12 or 13, wherein said flanges are provided with bore holes for fastening on the components.

15. A flange assembly according to claim 1, wherein a connection of said flanges to said compensation element is provided via integral joining methods, in particular welded connections.

16. A flange assembly according to claim 1, wherein a connection of said flanges to said compensation element is provided via frictionally locking joining methods, in particular cone connections.

17. A flange assembly according to claim 1, wherein at least one flange is conically embodied on at least one connection side which is connected to said compensation element.

18. A flange assembly according to claim 17, wherein at least one connection side which is embodied with the cone is provided with a groove, in particular an adhesive groove.

19. A method for coupling to one another two flanges of the type used for supporting components of an optical system having an optical axis, said method comprising the steps of:
providing a first flange having a first coefficient of linear thermal expansion;
providing a second flange having a second coefficient of linear thermal expansion which differs from said first coefficient of linear thermal expansion;
interposing between said first flange and said second flange in a direction corresponding to the optical axis of the optical system a compensation element having a third coefficient of linear thermal expansion, and forming a shrink connection between said compensation element and at least one of said first flange and said second flange.

20. A method for coupling to one another two flanges of the type used for supporting components of an optical system having an optical axis, said method comprising the steps of:
providing a first flange having a first coefficient of linear thermal expansion;
providing a second flange having a second coefficient of linear thermal expansion which differs from said first coefficient of linear thermal expansion;
interposing between said first flange and said second flange in a direction corresponding to the optical axis of the optical system a compensation element having a third coefficient of linear thermal expansion, and forming a pressed connection between said compensation element and at least one of said first flange and said second flange.

21. A method according to claim 19 or 20, wherein at least one flange is conically embodied on at least one connection side which is connected to said compensation element, and the connection is performed via conical pressing.

22. A method according to claim 19, wherein at least one of said first flange and said second flange is secured to said compensation element by means of an integral joining method.

23. The use of a flange assembly according to claim 1 in semiconductor lithography.

24. An objective, comprising: an objective housing in which at least one optical element is arranged in a mount, and comprising a flange assembly which has a first flange, a compensation element and a second flange, said flanges and said compensation element being substantially axially symmetric, both flanges are connectable to said objective housing and said mount of the optical system in a non-destructive, non-positive axially separable fashion, two flanges consisting of different materials with different coefficients of linear thermal expansion, and said compensation element being radially soft, but connecting said two flanges rigidly in their relative spatial position.

25. An objective, according to claim 24, wherein said compensation element comprises a thin-walled cross section.

26. An objective, according to claim 25, wherein said compensation element is of at least approximately cylindrical shape.

27. An objective, according to claim 25 or 26, wherein said cross section is closed.

28. An objective, according to claim 24, wherein said compensation element is monolithic with at least one flange.

29. An objective, according to claim 24, wherein said flanges are designed as annular flanges.

30. An objective, according to claim 29, wherein said flanges are provided for fastening on said objective housing and said mount by bore holes.

31. An objective, according to claim 24, wherein a connection of said flanges to said compensation element is provided via integral connecting methods, in particular adhesive connections.

32. An objective, according to claim 24, wherein the objective is a projection objective in semiconductor lithography.

33. A flange assembly of an optical system having an optical axis, said flange assembly, comprising: a first flange, a second flange and a compensation element between said first flange and said second flange, said compensation element coupling said first flange and said second flange to one another, said first flange, said second flange and said compensation element being substantially axially symmetric, both said first flange and said second flange being connectable to other components of the optical system in a non-destructive, non-positively axially separable fashion, said first flange having a coefficient of linear thermal expansion having a value $\alpha_1$, said second flange having a coefficient of linear thermal expansion having a value $\alpha_2$, said compensation element being radially yieldable but maintaining said first flange and said second flange in a substantially fixed relative spatial positional relationship, said compensation element having a coefficient of linear thermal expansion having a value $\alpha_3$ which lies between said values $\alpha_1$ and $\alpha_2$.

34. A flange assembly of an optical system having an optical axis, said flange assembly, comprising: a first flange, a second flange and a compensation element, said compensation element being monolithic with said first flange and being connected to said second flange, said first flange, said second flange and said compensation element being substantially axially symmetric, both said first flange and said second flange being connectable to other components of the optical system in a non-destructive, non-positively axially separable fashion, said first flange being of a first material having a coefficient of linear thermal expansion having a value $\alpha_1$, said second flange being of a second material having a coefficient of linear thermal expansion having a value $\alpha_2$ which differs from said value $\alpha_1$, said compensation element being radially yieldable but maintaining said first flange and said second flange in a substantially fixed relative spatial positional relationship.

35. A flange assembly of an optical system having an optical axis, said flange assembly, comprising: a first flange, a second flange and a compensation element between said first flange and said second flange, said compensation element coupling said first flange and said second flange to one another, said first flange, said second flange and said compensation element being substantially axially symmetric, said compensation element being substantially cylindrical, both said first flange and said second flange being connectable to other components of the optical system in a non-destructive, non-positively axially separable fashion, said first flange having a coefficient of linear thermal expansion having a value $\alpha_1$, said second flange having a coefficient of linear thermal expansion having a value $\alpha_2$ which differs from said value $\alpha_1$, said compensation element being radially yieldable but maintaining said first flange and said second flange in a substantially fixed relative spatial positional relationship.

36. A flange assembly of an optical system having an optical axis, said flange assembly, comprising:
a first flange, a second flange and a compensation element between said first flange and said second flange, said compensation element coupling said first flange and said second flange to one another, said first flange and said second flange being mutually axially spaced from one another along the optical axis, said first flange, said second flange and said compensation element being substantially axially symmetric, said first flange and said second flange each being connectable to other components of the optical system in a non-destructive, non-positively axially separable fashion, said first flange having a coefficient of linear thermal expansion having a value $\alpha_1$, said second flange having a coefficient of linear thermal expansion having a value $\alpha_2$ which differs from said value $\alpha_1$, said compensation element being radially yieldable but maintaining said first flange and said second flange in a substantially fixed relative spatial positional relationship, said compensation element having a first portion connected to said first flange at a first site of coefficient of linear thermal expansion transition and a second portion connected to said second flange at a second site of coefficient of linear thermal expansion transition, said compensation element further having and an intermediate portion lying axially between said first portion and said second portion.

37. A flange assembly as claimed in claim 36 wherein said compensation element has a coefficient of linear thermal expansion having a value $\alpha_3$ which lies between said values $\alpha_1$ and $\alpha_2$.

38. A method according to claim 20, wherein at least one of said first flange and said second flange is secured to said compensation element by means of an integral joining method.

39. A method according to claim 21, wherein at least one of said first flange and said second flange is secured to said compensation element by means of an integral joining method.

* * * * *